(12) United States Patent
Morita et al.

(10) Patent No.: US 8,080,614 B2
(45) Date of Patent: Dec. 20, 2011

(54) CURABLE ORGANOPOLYSILOXANE COMPOSITION AND SEMICONDUCTOR DEVICE

(75) Inventors: Yoshitsugu Morita, Chiba (JP); Masayoshi Terada, Chiba (JP); Hiroji Enami, Chiba (JP); Makoto Yoshitake, Chiba (JP)

(73) Assignee: Dow Corning Toray Company, Ltd., Chiyoda-ku, Tokyo (JP)

( * ) Notice: Subject to any disclaimer, the term of this patent is extended or adjusted under 35 U.S.C. 154(b) by 0 days.

(21) Appl. No.: 12/306,049

(22) PCT Filed: Jun. 18, 2007

(86) PCT No.: PCT/JP2007/062649
§ 371 (c)(1),
(2), (4) Date: Dec. 22, 2008

(87) PCT Pub. No.: WO2007/148812
PCT Pub. Date: Dec. 27, 2007

(65) Prior Publication Data
US 2009/0179180 A1    Jul. 16, 2009

(30) Foreign Application Priority Data

Jun. 23, 2006 (JP) .................................. 2006-173777

(51) Int. Cl.
*C08L 83/04* (2006.01)
(52) U.S. Cl. .......... 525/100; 525/407; 526/194; 528/10
(58) Field of Classification Search ................ 525/100, 525/407; 528/15, 10; 526/194
See application file for complete search history.

(56) References Cited

U.S. PATENT DOCUMENTS

| 6,001,943 A | 12/1999 | Enami et al. |
| 2008/0262158 A1* | 10/2008 | Morita et al. ............... 525/100 |

FOREIGN PATENT DOCUMENTS

| JP | 08176447 A | 7/1996 |
| JP | 11001619 A | 1/1999 |
| JP | 2003128992 A | 5/2003 |
| WO | WO 0117570 A1 | 3/2001 |

OTHER PUBLICATIONS

English language translation and abstract for JP 08176447 extracted from PAJ database dated Dec. 9, 2007, 39 pages.
English language translation and abstract for JP 11001619 extracted from PAJ database dated May 26, 2009, 33 pages.
English language translation and abstract for JP 2003128992 extracted from PAJ database dated May 26, 2009, 24 pages.
PCT International Search Report for PCT/JP2007/062649, dated Sep. 13, 2007, 3 pages.

* cited by examiner

*Primary Examiner* — Mark Kopec
*Assistant Examiner* — Haidung Nguyen
(74) *Attorney, Agent, or Firm* — Howard & Howard Attorneys PLLC

(57) ABSTRACT

A curable organopolysiloxane composition comprises at least the following components: an organopolysiloxane (A) represented by the following general formula: $R^1_3SiO(R^1_2SiO)_m SiR^1_3$ (where $R^1$ is a monovalent hydrocarbon group, and "m" is an integer from 0 to 100); an organopolysiloxane (B) represented by the following average unit formula: $(R^2SiO_{3/2})_a (R^2_2SiO_{2/2})_b(R^2_3SiO_{1/2})_c$ (where $R^2$ is a monovalent hydrocarbon group, and "a", "b", and "c" are specific numbers); an organopolysiloxane (C) having in one molecule on average at least two silicon-bonded aryl groups and on average at least two silicon-bonded hydrogen atoms; and a hydrosilylation-reaction catalyst (D); is characterized by good fillability and curability and that, when cured, forms a cured body that possesses a high refractive index, high light transmissivity, and strong adhesion to various substrates.

16 Claims, 1 Drawing Sheet

CURABLE ORGANOPOLYSILOXANE COMPOSITION AND SEMICONDUCTOR DEVICE

RELATED APPLICATIONS

This application claims priority to and all the advantages of International Patent Application No. PCT/JP2007/062649, filed on Jun. 18, 2007, which claims priority to Japanese Patent Application No. JP2006-173777, filed on Jun. 23, 2006.

TECHNICAL FIELD

The present invention relates to a curable organopolysiloxane composition and to a semiconductor device. More specifically, the invention relates to a curable organopolysiloxane composition that possesses good curability and, when cured, forms a cured body having a high refractive index, high light transmissivity, and strong adhesion to various substrates. The invention also relates to a semiconductor device of excellent reliability.

BACKGROUND ART

Curable organopolysiloxane compositions that can be cured by a hydrosilylation reaction are used for forming protective coatings on photo-couplers, light-emitting diodes, solid-state imaging elements, or similar optical semiconductor elements among semiconductor devices. It is required that such protective coatings for semiconductor elements should neither absorb light generated or received by the aforementioned elements, nor should they dissipate this light.

A curable organopolysiloxane composition that is cured by a hydrosilylation reaction and that forms a cured body having a high refractive index and a high light transmissivity can be exemplified by the following: a curable organopolysiloxane composition comprising an organopolysiloxane having phenyl and alkenyl groups, an organohydrogencyclosiloxane, and a hydrosilylation-reaction catalyst (see Japanese Unexamined Patent Application Publication (hereinafter referred to as "Kokai") H08-176447); a curable organopolysiloxane composition comprising a liquid or solid organopolysiloxane that contains phenyl and alkenyl groups and has viscosity at 25° C. equal to or greater than 10,000 mPa·s, an organohydrogenpolysiloxane having in one molecule at least two silicon-bonded hydrogen atoms, and a hydrosilylation catalyst (see Kokai H11-1619); and a curable organopolysiloxane composition comprising an organopolysiloxane having aryl and alkenyl groups, an organopolysiloxane having in one molecule at least two silicon-bonded hydrogen atoms, and a catalyst in the form of a platinum complex of an aryl-containing organosiloxane oligomer (see Kokai 2003-128992).

However, the aforementioned curable organopolysiloxane compositions are high in viscosity and therefore have poor fillability. Furthermore, they have poor curability since their curing reaction temperatures are high.

It is an object of the present invention to provide a curable organopolysiloxane composition that is characterized by good fillability and curability and that, when cured, forms a cured body that possesses a high refractive index, high light transmissivity, and strong adhesion to various substrates. It is another object to provide a semiconductor device that is made by using the aforementioned composition and that possesses excellent reliability.

DISCLOSURE OF INVENTION

The curable organopolysiloxane composition of the present invention comprises at least the following components:

100 parts by mass of an organopolysiloxane (A) represented by the following general formula:

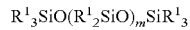

(where $R^1$ may be the same or different substituted or unsubstituted monovalent hydrocarbon groups; however, in one molecule at least two $R^1$s should be alkenyl groups; at least one of $R^1$s should be an aryl group; and "m" is an integer from 0 to 100);

10 to 150 parts by mass of an organopolysiloxane (B) represented by the following average unit formula:

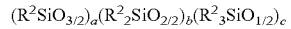

{where $R^2$ may be the same or different substituted or unsubstituted monovalent hydrocarbon groups; however, in one molecule 0.5 or more mole % of $R^2$s should be alkenyl groups; 25 or more mole % of $R^2$s should be aryl groups; and "a", "b", and "c" should be numbers that satisfy the following conditions: $0.30 \leq a \leq 0.60$; $0.30 \leq b \leq 0.55$; $(a+b+c)=1$, and $0.10 \leq [c/(a+b)] \leq 0.30$};

an organopolysiloxane (C) having in one molecule on average at least two silicon-bonded aryl groups and on average at least two silicon-bonded hydrogen atoms {wherein silicon-bonded hydrogen atoms of this component are used in an amount of 0.1 to 10 moles per one mole of the total number of alkenyl groups contained in component (A) and component (B)}; and a hydrosilylation-reaction catalyst (D) (used in an amount sufficient for curing the present composition).

A semiconductor device of the invention has a semiconductor element coated with a cured body of the curable organopolysiloxane composition of the present invention.

EFFECTS OF INVENTION

A curable organopolysiloxane composition of the present invention is characterized by good fillability and curability, while a cured body of the composition is characterized by a high refractive index, high light transmissivity, and strong adherence to substrates. Furthermore, the semiconductor device of the invention made with the use of the aforementioned composition is characterized by high reliability.

REFERENCE NUMERALS

Figure 1:
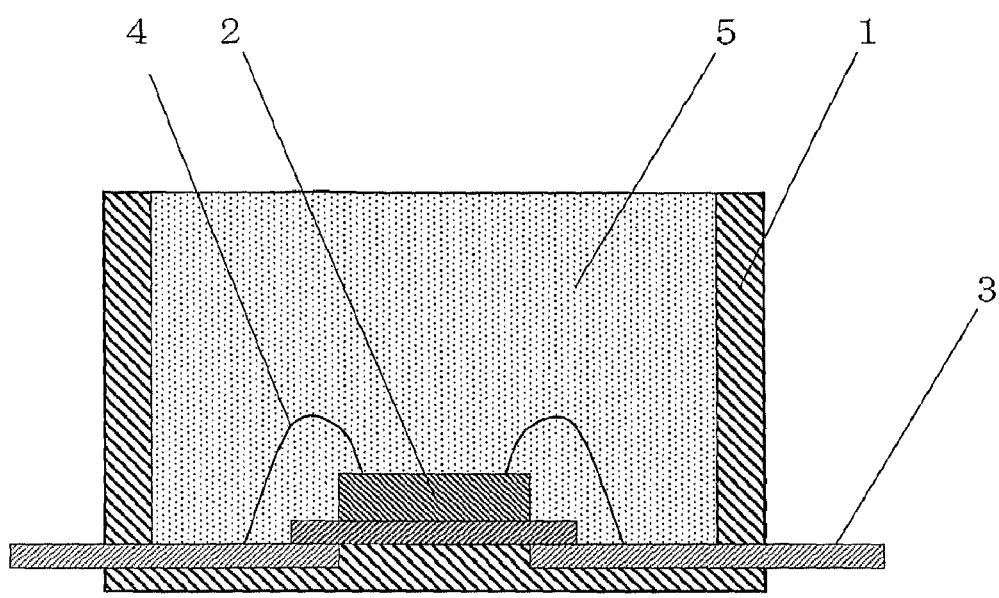
FIG. 1 is a sectional view of the surface-mount-type LED as an example of a semiconductor device of the present invention.

1: polyphtalamide (PPA) made case
2: LED chip
3: inner leads
4: bonding wires
5: cured body of curable organopolysiloxane composition

DETAILED DESCRIPTION OF THE INVENTION

Let us first consider in more detail the curable organopolysiloxane composition of the invention.

The organopolysiloxane that constitutes component (A) is the main component of the composition that improves curability and reduces the viscosity thereof. This component is represented by the following general formula:

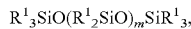
$R^1_3SiO(R^1_2SiO)_m SiR^1_3$, where $R^1$ may be the same or different substituted or unsubstituted monovalent hydrocarbon groups such as methyl, ethyl, propyl, butyl, pentyl, hexyl, heptyl, or similar alkyl groups; vinyl, allyl, butenyl, pentenyl, hexenyl, or similar alkenyl groups; phenyl, tolyl, xylyl, naphthyl, or similar aryl groups; benzyl, phenethyl, or similar aralkyl groups; chloromethyl, 3-chloropropyl, 3,3,3-trifluoropropyl, or similar halogenated alkyl groups. Preferable among these are methyl, vinyl, and phenyl groups. However, in order to impart sufficient curability to the composition, it is required that at least two $R^1$s (silicon-bonded organic groups) in one molecule be alkenyl groups. Particularly preferable among alkenyl groups are vinyl groups. From the viewpoint of refraction and reduced attenuation of light caused by scattering in a cured body obtained by curing the composition, it is recommended that at least one of $R^1$s (all silicon-bonded organic groups) be an aryl group, of which most preferable is a phenyl group. In the above formula, "m" in an integer from 0 to 100, preferably 1 to 100, more preferably 2 to 100, and most preferably 2 to 50. If the value of "m" is below the recommended lowest limit, this will either reduce flexibility of the obtained cured body or will cause a tendency to reduce adhesion to substrates. On the other hand, if the value of "m" exceeds the recommended upper limit, this will either impair fillability or will cause a tendency to impair mechanical properties of the obtained cured body.

Aforementioned component (A) is exemplified by an organopolysiloxane of the formulae given below, where "m" is an integer ranging from 2 to 100, and m' and m" are integers in the range of 1 to 99. However, (m'+m") is an integer ranging from 2 to 100.

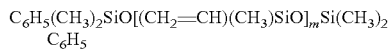
$C_6H_5(CH_3)_2SiO[(CH_2=CH)(CH_3)SiO]_m Si(CH_3)_2 C_6H_5$

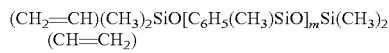
$(CH_2=CH)(CH_3)_2SiO[C_6H_5(CH_3)SiO]_m Si(CH_3)_2 (CH=CH_2)$

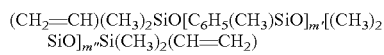
$(CH_2=CH)(CH_3)_2SiO[C_6H_5(CH_3)SiO]_{m'}[(CH_3)_2 SiO]_{m''} Si(CH_3)_2(CH=CH_2)$

$(CH_2=CH)(CH_3)_2SiO[(C_6H_5)_2SiO]_m Si(CH_3)_2 (CH=CH_2)$

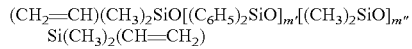
$(CH_2=CH)(CH_3)_2SiO[(C_6H_5)_2SiO]_{m'}[(CH_3)_2SiO]_{m''} Si(CH_3)_2(CH=CH_2)$ Especially to improve curability, it is recommended to use component (A) represented by an organopolysiloxane having alkenyl groups bonded to a silicon atom on a molecular terminal.

An organopolysiloxane that constitutes component (B) is one of the main components that is used for improving curability of the composition and for obtaining a soft cured body. This component is represented by the following average unit formula:

$(R^2SiO_{3/2})_a(R^2_2SiO_{2/2})_b(R^2_3SiO_{1/2})_c$

In the above formula, $R^2$ may be the same or different substituted or unsubstituted monovalent hydrocarbon groups, which are exemplified by the same monovalent hydrocarbon groups as those given for $R^1$ above, of which most preferable are methyl, vinyl, and phenyl groups. However, in order to provide sufficient curability, 0.5 mole % or more of the $R^2$s should be alkenyl groups, of which most preferable are vinyl groups. From the viewpoint of refraction, reflection, and reduced attenuation of light by scattering in a cured body, it is recommended that 25 mole % or more, preferably more than 40 mole %, and even more preferably, more than 45 mole % of $R^2$s be aryl groups. It is preferable that $R^2$ in the siloxane group of unit formula $R^2SiO_{3/2}$ be an aryl group, especially a phenyl group. Furthermore, it is preferable that $R^2$ in the above siloxane unit formula $R^2_2SiO_{2/2}$ be an allyl group and/or an aryl group, in particular, a methyl group and/or a phenyl group. The aforementioned siloxane unit can be exemplified by a siloxane unit of formula $C_6H_5(CH_3)SiO_{2/2}$; a siloxane unit of formula $(C_6H_5)_2SiO_{2/2}$; or a siloxane unit of formula $(CH_3)_2SiO_{2/2}$. Furthermore, the siloxane unit of formula $R^2_3SiO_{1/2}$ may have at least one $R^2$ as an alkenyl group and others selected from alkyl groups and/or aryl groups. Most preferable is a siloxane unit wherein at least one $R^2$ is a vinyl group, and other $R^2$s are selected from methyl or phenyl groups. Such siloxane units are exemplified by those represented by the following formula: $(CH_2=CH)(CH_3)_2SiO_{1/2}$. Furthermore, the siloxane units represented by the formula $R^2_3SiO_{1/2}$ may comprise siloxane units where $R^2$ is an alkyl group and/or an aryl group, in particular, siloxane units where $R^2$ is a methyl group and/or a phenyl group. Such siloxane units may also be represented by formula $(CH_3)_3SiO_{1/2}$ and by formula $C_6H_5(CH_3)_2SiO_{1/2}$. In the above formulas, "a", "b", and "c" are numbers that satisfy the following conditions: $0.30 \leq a \leq 0.60$; $0.30 \leq b \leq 0.55$; $(a+b+c)=1.00$; and $0.10 \leq [c/(a+b)] \leq 0.30$.

There are no special restrictions with regard to viscosity of aforementioned component (B) at 25° C., but it is recommended that this viscosity range from 10 to 1,000,000 mPa·s, in particular, in the range of 100 to 50,000 mPa·s. If the viscosity is below the recommended lower limit, this will reduce mechanical properties of a cured body obtained by curing the composition, and if on the other hand, the viscosity exceeds the recommended upper limit, this will impair fillability of the obtained composition. Similarly, there are no special restrictions with regard to the molecular weight of component (B), but it is recommended that the mass-average molecular weight referenced to polystyrene be in the range of 500 to 10,000, preferably in the range of 700 to 6,000. If the mass-average molecular weight is below the recommended lower limit, this will impair the mechanical characteristics of the cured body, and if, on the other hand, this characteristic exceeds the recommended upper limit, this will impair fillability of the obtained composition.

In the composition of the invention, component (B) is contained in an amount of no less than 10 parts by mass, preferably no less than 50 parts by mass, and even more preferably, no more than 150 parts by mass, and most preferably, no more than 120 parts by mass per 100 parts by mass of component (A). More specifically, component (B) can be contained in the range of 10 to 150 parts by mass, preferably 10 to 120 parts by mass, more preferably 50 to 120 parts by mass, or 50 to 150 parts by mass per 100 parts of component (A). If the content of component (B) is below the recommended lower limit, this will impair curability of the obtained composition or will reduce the mechanical properties of a cured body obtained from the composition. If, on the other hand, the content of component (B) exceeds the recommended upper limit, this will impair adhesion of the cured body to a substrate.

Component (C) is a curing agent of the composition which comprises an organopolysiloxane having in one molecule on average at least two silicon-bonded aryl groups and on average at least two silicon-bonded hydrogen atoms. The bonding position of the silicon-bonded hydrogen atoms in component (C) may be located at the molecular terminals and/or in the side chains of the molecules. Silicon-bonded aryl groups contained in component (C) can be exemplified by phenyl, tolyl, xylyl, and naphthyl groups. Most preferable are phenyl groups. In order to decrease attenuation of light caused by refraction, reflection, and dissipation when light is transmitted through a cured body, it is recommended that the content of aryl groups among all silicon-bonded groups in a molecule of component (C) be no less than 10 mole %. Other silicon-bonded groups of component (C) may comprise methyl, ethyl, propyl, butyl, pentyl, hexyl, heptyl, or similar alkyl groups; benzyl, phenethyl, or similar aralkyl groups; chloromethyl, 3-chloropropyl, 3,3,3-trifluoropropyl, or similar halogen-substituted alkyl groups, of which most preferable are methyl groups. Component (C) may have a linear, branched, cyclic, net-like, or partially branched linear molecular structure. The linear structure is preferable. There are no special restrictions with regard to the viscosity of component (C) at 25° C., but it may be recommended that this viscosity be in the range of 1 to 500,000 mPa·s, preferably in the range of 1 to 100,000 mPa·s, and most preferably in the range of 5 to 100,000 mPa·s. If the viscosity is below the recommended lower limit, this will impair the mechanical properties of a cured body obtained from the composition, and if the viscosity exceeds the recommended upper limit, this will impair fillability of the obtained composition.

The organopolysiloxane of component (C) may be exemplified the following compounds: methylhydrogenpolysiloxane capped at both molecular terminals with dimethylphenylsiloxy groups; a copolymer of methylhydrogensiloxane and dimethylsiloxane capped at both molecular terminals with dimethylphenylsiloxy groups; a copolymer of methylphenylsiloxane, methylhydrogensiloxane, and dimethylsiloxane capped at both molecular terminals with trimethylsiloxy groups; a copolymer of methylphenylsiloxane and dimethylsiloxane capped at both molecular terminals with dimethylhydrogensiloxy groups; methylphenylpolysiloxane capped at both molecular terminals with dimethylhydrogensiloxy groups; a copolymer of an organopolysiloxane composed of siloxane units represented by formula $R^3_3SiO_{1/2}$, siloxane units represented by formula $R^3_2HSiO_{1/2}$ and siloxane units of formula $SiO_{4/2}$; a copolymer of an organopolysiloxane composed of siloxane units represented by formula $R^3_2HSiO_{1/2}$ and siloxane units represented by formula $SiO_{4/2}$; a copolymer of an organopolysiloxane composed of siloxane units represented by formula $R^3HSiO_{2/2}$ and siloxane units represented by formula $R^3SiO_{3/2}$ or siloxane units of formula $HSiO_{3/2}$; or a mixture of two or more of the aforementioned organopolysiloxane. In the above formulas, $R^3$ designates an alkyl, aryl, aralkyl, or a halogen-substituted alkyl group, which may be exemplified by the same examples as above. However, on average at least one group of groups designated by $R^3$ should be an aryl group. Preferably such an aryl group comprises a phenyl group. From the viewpoint of improved curability of the composition, component (C) should comprise a linear-chain organopolysiloxane having in one molecule at least two silicon-bonded aryl groups and having both terminals capped with silicon-bonded hydrogen atoms.

In the composition of the invention, component (C) should be contained in an amount such that the content of silicon-bonded hydrogen atoms of the present component be in the range of 0.1 to 10 moles, preferably 0.1 to 5 moles, and more preferably 0.5 to 1.5 moles per one mole of the sum of alkenyl groups contained in components (A) and (B). If the content of component (C) is below the recommended lower limit, this will lead to incomplete curing of the obtained composition. If, on the other hand, the content of component (C) exceeds the recommended upper limit, this will impair the mechanical properties and the thermal resistance of the cured body obtained from the composition.

The hydrosilylation-reaction catalyst, which is component (D), is used to accelerate curing of the composition. Component (D) can be represented by a platinum-type catalyst, a rhodium-type catalyst, and a palladium-type catalyst. Use of a platinum-type catalyst is preferable because such catalyst most efficiently accelerates curing of the composition. Examples of the platinum-type catalyst are the following: a fine platinum powder, chloroplatinic acid, an alcohol solution of a chloroplatinic acid, a complex of platinum and an alkenylsiloxane, a complex of platinum and an olefin, and a complex of platinum and carbonyl containing compound. Most preferable is a complex of platinum and an alkenylsiloxane. The alkenylsiloxane suitable for these purposes can be exemplified by the following: 1,3-divinyl-1,1,3,3-tetramethyldisiloxane; 1,3,5,7-tetramethyl-1,3,5,7-tetravinylcyclotetrasiloxane; aforementioned alkenylsiloxanes in which a part of methyl groups is substituted with ethyl groups, phenyl groups, etc; and aforementioned alkenylsiloxanes in which vinyl groups are substituted with allyl groups, hexenyl groups, or the like. From the viewpoint of stability of platinum complexes of alkenylsiloxane, it is recommended to use 1,3-divinyl-1,1,3,3-tetramethyldisiloxane. From the viewpoint of further improvement of improved stability, the aforementioned complexes can be combined with an organosiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinylcyclotetrasiloxane, or a similar alkenylsiloxane or methylsiloxane oligomer. The addition of an alkenylsiloxane is preferable.

There are no special restrictions with regard to the amounts in which component (D) can be used, provided that it accelerates curing of the composition. It may be recommended, however, to use component (D) in an amount such that the content of metallic atom in the present component (in mass units) be in the range of 0.01 to 500 ppm, preferably 0.01 to 50 ppm. If component (D) is contained in an amount less than the recommended lower limit, it will be difficult to provide complete curing of the composition. If the content of component (D) exceeds the recommended upper limit, a change in color may occur in the cured body obtained from the composition.

The composition may contain some arbitrary components such as 2-methyl-3-butyn-2-ol, 3,5-dimethyl-1-hexyn-3-ol, 2-phenyl-3-butyn-2-ol, or similar alkyne alcohols; 3-methyl-3-penten-1-yne, 3,5-dimethyl-3-hexen-1-yne, or a similar enyne compound; 1,3,5,7-tetramethyl-1,3,5,7-tetravinylcyclotetrasiloxane, 1,3,5,7-tetramethyl-1,3,5,7-tetrahexenylcyclotetrasiloxane, benzotriazole, or similar reaction inhibitors. There are no special restrictions with regard to amounts in which such reaction inhibitors can be used, but it may be recommended to add them in an amount of 0.0001 to 5 parts by mass per 100 parts by mass of the sum of components (A) and (B).

In order to improve adhesive properties of the composition, the composition may also contain some adhesion-imparting agents. Such adhesion-imparting agents may comprise an organic silicon compound that contains in one molecule at least one silicon-bonded alkoxy group. Such an alkoxy group can be exemplified by a methoxy, ethoxy, propoxy, or methoxyethoxy group. Most preferable is a methoxy group. Groups other than silicon-bonded alkoxy groups contained in the aforementioned organic silicon compound may be exemplified by the following groups: a substituted or nonsubstituted univalent hydrocarbon group such as an alkyl, alkenyl, aryl, aralkyl, halogen-substituted alkyl, or another group represented above by $R^1$; 3-glycidoxypropyl, 4-glycidoxybutyl, or a similar glycidoxyalkyl group; 2-(3,4-epoxycyclohexyl)-ethyl, 3-(3,4-epoxycyclohexyl)-propyl, or a similar epoxycyclohexylalkyl group; 4-oxiranylbutyl, 8-oxiranyloctyl, or a similar oxiranylalkyl group, or other epoxy-containing univalent organic groups; 3-methacryloxypropyl or similar acryl-containing univalent organic groups; or a hydrogen atom. It is recommended that the aforementioned organic silicon compounds contain groups capable of reacting with components (A) and (B) or (C). More specifically, these compounds may be silicon-bonded alkenyl groups or silicon-bonded hydrogen atoms. Furthermore, in order to improve adhesion to various substrates, the aforementioned organic compounds should contain univalent organic groups having in one molecule at least one epoxy group. Such organic compounds can be exemplified by organosilane compounds, organosiloxane oligomers, or alkylsilicates. Such organosilane oligomers or organosilicates may have a linear, partially branched linear, branched, cyclic, or net-like molecular structure. Most preferable is a linear, branched, or net-like molecular structure. Examples of such organic silicon compounds are the following: 3-glycidoxypropyltrimethoxysilane, 2-(3, 4-epoxycyclohexyl)ethyltrimethoxysilane, 3-methaeryloxypropyltrimethoxysilane, or similar silane compounds; siloxane compounds that contain in one molecule at least one of the following: a silicon-bonded alkenyl group or a silicon-bonded hydrogen atom and a silicon-bonded alkoxy group, a mixture of a siloxane or silane compound that has at least one alkoxy group with a siloxane compound that contains in one molecule at least one silicon-bonded hydroxyl group and at least one silicon-bonded alkenyl group; a siloxane compound represented by the following formula:

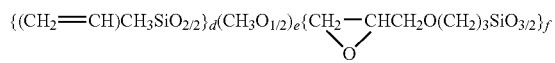

(where "d", "e", and "f" are positive numbers); a siloxane compound represented by the following formula:

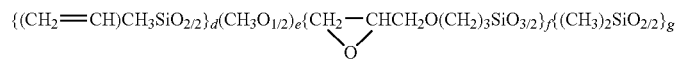

(where "d", "e", "f", and "g" are positive numbers); methylpolysilicate, ethylpolysilicate, or epoxy-containing ethylpolysilicate. It is recommended that such adhesion-imparting agents comprise liquids of low viscosity. There are no special restrictions with regard to the viscosity of such liquids at 25° C., but it is recommended that viscosity be in the range of 1 to 500 mPa·s. There are no special restrictions regarding the amounts in which such adhesion-imparting agents can be used in the composition of the invention, but, in general, it is recommended to use them in an amount of 0.01 to 10 parts by mass per 100 parts by mass of the sum of components (A) and (B).

Within the limits that are not detrimental to the objects of the present invention, the composition may contain other arbitrary components such as silica, glass alumina, zinc oxide, or a similar inorganic filler; fine powder of polymethacrylate resin or a similar organic resin; heat-resistant agents, dyes, pigments, flame retardants, solvents, etc.

There are no special limitations with regard to the viscosity of the composition, itself, at 25° C., but for better fillability it is recommended that the viscosity of the composition be not more than 10,000 mPa·s, preferably not more than 5,000 mPa·s, and even more preferably not more than 3,000 mPa·s.

It is preferable that a cured body obtained by curing the composition of the invention have an index of refraction at 25° C. in visible light (589 µm) equal to or greater than 1.5. It is also recommended that a cured body obtained by curing the composition of the invention have light transmissivity (at 25° C.) equal to or greater than 80%. If the index of refraction of a cured body is below 1.5 or if light transmissivity is below 80%, then a semiconductor device that contains a semiconductor element coated with a cured layer of such a composition may not be sufficiently reliable. In order to obtain a desired curable organopolysiloxane capable of producing a cured body having a high index of refraction and high light transmissivity, it is recommended that all components from (A) to (D) have almost the same indices of refraction. More specifically, it is recommended to use component (B) in the form of an organopolysiloxane wherein more than 40 mole %, preferably more than 45 mole %, of silicon-bonded organic groups are aryl groups, where silicon-bonded organic groups other than aryl and alkenyl groups may comprise alkyl groups, in particular, methyl groups, and to use component (C) in the form of an organopolysiloxane wherein more than 10 mole % of silicon-bonded groups are aryl groups and where silicon-bonded organic groups other than aryl groups are alkyl groups, in particular, methyl groups. The index of refraction can be measured, e.g., by an Abbe-type refractometer. In this case, it is possible to measure indices of refraction of light of any wavelength by changing the wavelength of the light source used in the Abbe-type refractometer. Light transmissivity can be measured, e.g., by a spectrophotometer, in a cured body having an optical path of 1.0 mm.

There are no special restrictions with regard to a method used for curing the composition of the invention, and the curing reaction can be carried out at room temperature or by heating. Curing with heating is preferable for accelerating the curing process. The heating temperature can range from 50 to 200° C. A cured body obtained by curing the composition of the invention can be produced in elastomeric form, in particular, in gel-like form, or in the form of soft rubber. A gel-like form is preferable. A gel-like cured body should have ¼ consistency, specified by JIS K 2220, that is equal to or greater than 5, and preferably in the range of 5 to 200.

The composition of the invention can be used as an adhesive agent, potting agent, protective-coating agent, and an underfiller agent in conjunction with electric and electronic elements. In particular, the composition is suitable for use as an adhesive agent, potting agent, protective-coating agent, and underfiller agent for optical semiconductor elements.

The following is a detailed description of a semiconductor device of the invention.

A semiconductor device of the invention is characterized by having a semiconductor element coated with a cured body of the above-described curable organopolysiloxane. Such a semiconductor element may comprise a light-emitting device, light-receiving device, or a similar optical semiconductor element. A typical example of an optical semiconductor element is a LED (light-emitting diode) chip or a semiconductor of an InN-type, AlN-type, GaN-type, ZnSe-type, SiC-type, GaP-type, GaAs-type, GaAlAs-type, GaAlN-type, AlInGaP-type, InGaN-type, AlInGaN-type, etc., which is formed on a substrate by growing from a liquid phase or by MOCVD [Metal Organic Chemical Vapor Deposition] and which has a light-emitting layer. A semiconductor device of the invention can be exemplified by a surface-mount-type LED and a device wherein an optical semiconductor element (e.g., a LED chip) is placed into a recess of a case made from a heat-resistant organic resin (such as polyphthalamide resin, polyphenylene sulfide resin, or a polyethernitrile resin) and is sealed in the aforementioned case with a transparent cured body of the aforementioned organopolysiloxane composition. A curable organopolysiloxane composition used in the above structure may form a cured body in the form of an elastomer, and preferably in the form of gel or soft resin, preferably, a gel-like cured body having ¼ consistency, specified by JIS K 2220, which is equal to or greater than 5, and preferably in the range of 5 to 200. During curing, the aforementioned organopolysiloxane composition strongly adheres to the part with which the composition is in contact, i.e., the heat-resistant organic resin, the semiconductor element (e.g., a LED chip), an inner lead, bonding wires, etc. The LED used in the aforementioned structure may be a shell-type LED. Examples of devices other than LEDs are photo-couplers and charge-coupled devices (CCDs).

Furthermore, the LEDs may be of a lens-incorporating type or non-incorporating type. An example of a non-incorporating type LED is shown in FIG. 1. The device contains an LED chip 2 that is placed onto the central part of a polyphthalamide (PPA) resin case above inner leads 3 that extend from the side walls of the case 1 toward the case center. The LED chip 2 and the inner leads 3 are electrically connected by means of bonding wires 4. In the practical examples of this invention, the interior of the polyphthalamide (PPA) resin case 1 is filled with a curable organopolysiloxane composition which was used in the practical examples of the invention. If necessary, the LED can be equipped with a lens made from a light-permeable material. When the filler is thermally cured, it forms a transparent cured body 5.

EXAMPLES

The curable organopolysiloxane composition and a semiconductor device of the present invention will be further illustrated by way of Practical and Comparative Examples. In these examples, all values of viscosity were measured at 25° C. Properties of the curable organopolysiloxane compositions and cured bodies thereof were measured, and the results of measurements are shown in Table 1.
[Curability of the Curable Organopolysiloxane Composition]

Curability of th curable organopolysiloxane composition was evaluated by curing the composition samples in a hot-air-circulation oven for 1 hour at 70° C., 120° C., and 150° C. and by determining the curability index by dividing the ¼ consistency according to JIS K 2220 measured in bodies cured at for 1 hour 150° C. by the values of ¼ consistency obtained in bodies cured at 70° C. and 120° C. The closer the obtained index is to 1, the better is the curability of the obtained curable organopolysiloxane composition.
[¼ Consistency of Cured Body]

Cured bodies were obtained by curing the composition samples in a hot-air-circulation oven for 1 hour at 70° C., 120° C., and 150° C., and ¼ consistency of the obtained cured bodies was determined in accordance with JIS K 2220.
[Index of Refraction of Light Passing Through Cured Bodies]

Samples of the curable organopolysiloxane composition were cured in a hot-air-circulation oven by heating for 1 hour at 120° C., and indices of refraction of the light passing through the obtained cured bodies were measured at 25° C. by means of an Abbe-type refractometer. Visible light of a light source used in measurement had a wavelength of 589 nm.
[Transmissivity of Light Through Cured Bodies]

Transmissivity (at 25° C.) of visible light (wavelength: 420 nm) was measured in cured bodies (optical-path length: 1.0 mm) obtained by curing samples of the curable organopolysiloxane composition for 1 hour at 120° C. in a hot-air-circulation oven.

Surface-mount-type LEDs using the curable organopolysiloxane composition of the invention were produced as described below. Reliability of the LEDs was evaluated by the method described below, and results of the evaluation are shown in Table 1.
[Manufacturing of Surface-Mount-Type LEDs]

LED chips 2 were arranged at the central part on the bottoms of sixteen cylindrical polyphthalamide (PPA) resin cases 1 (inner diameter: 2.0 mm; depth: 1.0 mm) above inner leads extending from the side walls of the cases 1 to the center. The inner leads and the LED chips were electrically connected by bonding wires 4, and the interiors of the resin cases 1 were filled by means of a dispenser with defoamed organopolysiloxane compositions used in subsequent practical and comparative examples. The compositions were cured by holding for 1 hour at 120° C., whereby sixteen surface-mount-type LEDs of the type shown in FIG. 1 were produced.
[Reliability and Coefficient of Peelability of Semiconductor Devices]

Each of the sixteen LEDs of the surface-mount type produced by the above-described method was subjected to five repetitive heat cycles by holding in each cycle for 30 sec. at 280° C., for 30 min. at −40° C., and then for 30 min. at 100° C. Following this, the samples were retained at room temperature (25° C.), and the conditions of adhesion of the cured bodies to the inner walls of the polyphthalamide (PPA) resin case 1 were observed under an optical microscope. The coefficient of peelability was determined as a percentage of LEDs with peeling of the cured body from the inner walls of the case 1 with respect to the total number (16) of the LEDs.

Practical Examples 1 to 3

Comparative Examples 1 to 4

Curable organopolysiloxane compositions were prepared by mixing the components given below and shown in Table 1 in parts by mass. In Table 1, [SiH/Vi] is the ratio of the mole number of silicon-bonded hydrogen atoms contained in the organopolysiloxane that contains silicon-bonded hydrogen atoms to 1 mole of vinyl groups in the organopolysiloxane component having vinyl groups.
(A-1): Methylphenylpolysiloxane of the following formula:

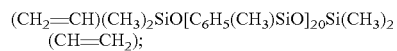

(A-2): Methylphenylpolysiloxane of the following formula:

(B-1): Viscous organopolysiloxane having mass-average molecular weight of 3,200, an index of refraction equal to 1.55, and represented by the following average unit formula:

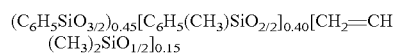

(ratio of vinyl groups to the total number of silicon-bonded organic group: 8.8 mole %; ratio of phenyl groups to total number of silicon-bonded organic groups: 50.0 mole %);
(B-2): Viscous organopolysiloxane having mass-average molecular weight of 4,500, an index of refraction equal to 1.55, and represented by the following average unit formula:

$(C_6H_5SiO_{3/2})_{0.50}[C_6H_5(CH_3)SiO_{2/2}]_{0.35}[CH_2=CH(CH_3)_2SiO_{1/2}]_{0.10}[(CH_3)_3SiO_{1/2}]_{0.05}$ (ratio of vinyl groups to the total number of silicon-bonded organic group: 5.9 mole %; ratio of phenyl groups to total number of silicon-bonded organic groups: 50.0 mole %);
(B-3): Viscous organopolysiloxane having mass-average molecular weight of 7,300, an index of refraction equal to 1.50, and represented by the following average unit formula:

$(C_6H_5SiO_{3/2})_{0.45}[(CH_3)_2SiO_{2/2}]_{0.40}[CH_2=CH(CH_3)_2SiO_{1/2}]_{0.15}$ (ratio of vinyl groups to the total number of silicon-bonded organic group: 8.8 mole %; ratio of phenyl groups to total number of silicon-bonded organic groups: 26.5 mole %);
(B-4): Solid organopolysiloxane having mass-average molecular weight of 2,400, an index of refraction equal to 1.55, and represented by the following average unit formula:

$(C_6H_5SiO_{3/2})_{0.75}[CH_2=CH(CH_3)_2SiO_{1/2}]_{0.25}$ (ratio of vinyl groups to the total number of silicon-bonded organic group: 16.7 mole %; ratio of phenyl groups to total number of silicon-bonded organic groups: 50.0 mole %);
(B-5): Solid organopolysiloxane having mass-average molecular weight of 7,700, an index of refraction equal to 1.58, and represented by the following average unit formula:

$(C_6H_5SiO_{3/2})_{0.75}[(CH_3)_2SiO_{2/2}]_{0.15}[CH_2=CH(CH_3)SiO_{2/2}]_{0.10}$ (ratio of vinyl groups to the total number of silicon-bonded organic group: 8.0 mole %; ratio of phenyl groups to total number of silicon-bonded organic groups: 60.0 mole %);
(B-6): Viscous organopolysiloxane having mass-average molecular weight of 86,000, an index of refraction equal to 1.55, and represented by the following average unit formula:

$(C_6H_5SiO_{3/2})_{0.25}[C_6H_5(CH_3)SiO_{2/2}]_{0.70}[CH_2=CH(CH_3)_2SiO_{1/2}]_{0.05}$ (ratio of vinyl groups to the total number of silicon-bonded organic group: 2.8 mole %; ratio of phenyl groups to total number of silicon-bonded organic groups: 52.3 mole %);
(B-7): Viscous organopolysiloxane having mass-average molecular weight of 6,500, an index of refraction equal to 1.47, and represented by the following average unit formula:

$(C_6H_5SiO_{3/2})_{0.27}[(CH_3)_2SiO_{2/2}]_{0.58}[CH_2=CH(CH_3)_2SiO_{1/2}]_{0.15}$ (ratio of vinyl groups to the total number of silicon-bonded organic group: 8.0 mole %; ratio of phenyl groups to total number of silicon-bonded organic groups: 14.4 mole %);
(C-1): Diphenylsiloxane oligomer having viscosity of 120 mPa·s and represented by the following formula:

$H(CH_3)_2SiO[(C_6H_5)_2SiO]_2Si(CH_3)_2H$ (ratio of phenyl groups to total number of silicon-bonded groups: 40.0 mole %);
(D-1): Complex of platinum and 1,3-divinyl-1,1,3,3-tetramethyldisiloxane. Reaction inhibitor: 1-ethynylcyclohexanol

TABLE 1

| | | | Examples | | | | | | |
|---|---|---|---|---|---|---|---|---|---|
| | | | Present Invention | | | Comparative Examples | | | |
| Items | | | Pr. Ex. 1 | Pr. Ex. 2 | Pr. Ex. 3 | Comp. Ex. 1 | Comp. Ex. 2 | Comp. Ex. 3 | Comp. Ex. 4 |
| Curable Organopolysiloxane Composition | Components (parts by mass) | (A-1) | 43 | 43 | 55 | 40 | 72 | — | 40 |
| | | (A-2) | 7 | 7 | 5 | 15 | — | — | — |
| | | (B-1) | 50 | — | — | — | — | — | — |
| | | (B-2) | — | 50 | — | — | — | — | — |
| | | (B-3) | — | — | 40 | — | — | — | — |
| | | (B-4) | — | — | — | 45 | — | — | — |
| | | (B-5) | — | — | — | — | 28 | — | — |
| | | (B-6) | — | — | — | — | — | 100 | — |
| | | (B-7) | — | — | — | — | — | — | 60 |
| | | (C-1) | 14.6 | 12 | 12.9 | 18.1 | 11 | 5 | 18 |
| | | (D-1) | In each composition this component contained 2.5 ppm of metallic platinum (in terms of mass units) | | | | | | |
| | | Reaction Inhibitor | 0.005 | 0.005 | 0.005 | 0.005 | 0.005 | 0.005 | 0.005 |
| | SiH/Vi | | 0.82 | 0.81 | 0.70 | 0.67 | 0.91 | 0.81 | 0.86 |
| | Properties | Viscosity (mPa·s) | 1600 | 2200 | 620 | 630 | 2600 | 36000 | 370 |
| | | ¼ Consistency 70° C. | 11 | 24 | 15 | — | Uncured | — | 40 |
| | | 120° C. | 10 | 21 | 14 | 35 | 23 | Uncured | 38 |
| | | 150° C. | 9 | 20 | 14 | 24 | 7 | Uncured | 38 |
| | | Curability 70° C. | 1.2 | 1.2 | 1.1 | — | — | — | 1.1 |
| | | 120° C. | 1.1 | 1.1 | 1.0 | 1.5 | 3.3 | — | 1.0 |
| Cured Body | | Transmissivity (%) | 100 | 100 | 100 | 100 | 100 | — | <1 (white turbidity) |
| | | Index of refraction | 1.54 | 1.52 | 1.53 | 1.51 | — | 1.53 | 1.49 |
| Reliability and peelability of semiconductor device | | | 0/16 | 0/16 | 0/16 | 2/16 | 4/16 | — | — |

INDUSTRIAL APPLICABILITY

The curable organopolysiloxane composition of the invention is suitable for use as an adhesive agent, potting agent, protective-coating agent, and an underfiller agent in conjunction with electric and electronic elements. In particular, in view of high transmissivity of light, the composition is suitable for use as an adhesive agent, potting agent, protective-coating agent, and an underfiller agent for optical semiconductor elements. A semiconductor device of the invention can be realized in the form of diodes, LEDs, transistors, thyristors, photocouplers, CCDs, monolithic ICs, hybrid ICs, LSIs, and VLSIs.

The invention claimed is:

1. A curable organopolysiloxane composition comprising at least the following components:

100 parts by mass of an organopolysiloxane (A) represented by the following general formula:

$$R^1{}_3SiO(R^1{}_2SiO)_m SiR^1{}_3$$

where $R^1$ may be the same or different substituted or unsubstituted monovalent hydrocarbon groups; wherein, in one molecule, at least two $R^1$s are alkenyl groups; at least one of the $R^1$s is an aryl group; and "m" is an integer from 0 to 100;

10 to 150 parts by mass of an organopolysiloxane (B) represented by the following average unit formula:

$$(R^2SiO_{3/2})_a(R^2{}_2SiO_{2/2})_b(R^2{}_3SiO_{1/2})_c$$

where $R^2$ may be the same or different substituted or unsubstituted monovalent hydrocarbon groups; wherein, in one molecule, 0.5 or more mole % of $R^2$s are alkenyl groups; 25 mole % or more of $R^2$s aryl groups; and "a", "b", and "c" are numbers that satisfy the following conditions: $0.30 \leq a \leq 0.60$; $0.30 \leq b \leq 0.55$; $(a+b+c)=1$, and $0.10 \leq [c/(a+b)] \leq 0.30$;

an organopolysiloxane (C) having in one molecule on average at least two silicon-bonded aryl groups and on average at least two silicon-bonded hydrogen atoms wherein the silicon-bonded hydrogen atoms component (C) are present in an amount of 0.1 to 10 moles per one mole of the total number of alkenyl groups contained in component (A) and component (B); and a hydrosilylation-reaction catalyst (D) present in an amount sufficient for curing the present composition.

2. The organopolysiloxane composition of claim 1, wherein component (B) is an organopolysiloxane having 40 mole % or more of $R^2$s as aryl groups.

3. The organopolysiloxane composition of claim 1, wherein component (C) is a linear organopolysiloxane having silicon-bonded hydrogen atoms on both molecular terminals.

4. The organopolysiloxane composition of claim 1 having a viscosity at 25° C. equal to or lower than 10,000 mPa·s.

5. The organopolysiloxane composition of claim 1, wherein a cured body obtained by curing the composition has a refractive index at 25° C. in visible light (589 nm) that is equal to or greater than 1.5.

6. The organopolysiloxane composition of claim 1, wherein a cured body obtained by curing the composition has a light transmittance at 25° C. equal to or greater than 80%.

7. The organopolysiloxane composition of claim 1, wherein a cured body obtained by curing the composition is a gel-type cured body.

8. The organopolysiloxane composition of claim 1, wherein a gel-type cured body obtained by curing the composition has ¼ consistency specified by JIS K 2220 in the range of 5 to 200.

9. A semiconductor device comprising a semiconductor element coated with a cured body of the curable organopolysiloxane composition according to claim 1.

10. The semiconductor device of claim 9, wherein the semiconductor element is a light-emitting element.

11. The organopolysiloxane composition of claim 1, wherein in one molecule at least two $R^1$s are vinyl groups and at least one of the $R^1$s is a phenyl group.

12. The organopolysiloxane composition of claim 1, wherein component (A) is an organopolysiloxane having alkenyl groups bonded to a silicon atom on a molecular terminal.

13. The organopolysiloxane composition of claim 1, wherein component (B) has a viscosity at 25° C. from 10 to 1,000,000 mPa·s.

14. The organopolysiloxane composition of claim 1, wherein component (B) has a viscosity at 25° C. from 100 to 50,000 mPa·s.

15. The organopolysiloxane composition of claim 1, wherein component (B) is contained in the composition in an amount of 10 to 150 parts by mass per 100 parts of component (A).

16. The organopolysiloxane composition of claim 1 having a viscosity at 25° C. equal to or lower than 5,000 mPa·s.

* * * * *